United States Patent
Zhou

(10) Patent No.: US 10,693,011 B2
(45) Date of Patent: Jun. 23, 2020

(54) THIN FILM TRANSISTOR ARRAY SUBSTRATE, METHOD OF MANUFACTURING THE SAME, AND DISPLAY DEVICE INCLUDING THIN FILM TRANSISTOR SUBSTRATE

(71) Applicant: Shenzhen China Star Optoelectronics Semiconductor Display Technology Co., Ltd., Shenzhen, Guangdong (CN)

(72) Inventor: Xingyu Zhou, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 333 days.

(21) Appl. No.: 15/741,132

(22) PCT Filed: Jul. 18, 2017

(86) PCT No.: PCT/CN2017/093424
§ 371 (c)(1),
(2) Date: Dec. 29, 2017

(87) PCT Pub. No.: WO2019/000508
PCT Pub. Date: Jan. 3, 2019

(65) Prior Publication Data
US 2019/0386143 A1 Dec. 19, 2019

(30) Foreign Application Priority Data

Jun. 28, 2017 (CN) .......................... 2017 1 0508076

(51) Int. Cl.
*H01L 29/786* (2006.01)
*H01L 27/12* (2006.01)
*H01L 21/02* (2006.01)

(52) U.S. Cl.
CPC .... *H01L 29/78618* (2013.01); *H01L 27/1255* (2013.01); *H01L 27/1274* (2013.01);
(Continued)

(58) Field of Classification Search
None
See application file for complete search history.

(56) References Cited

U.S. PATENT DOCUMENTS

2006/0151790 A1    7/2006  Kang et al.
2019/0386143 A1*  12/2019  Zhou ................. H01L 29/78618

FOREIGN PATENT DOCUMENTS

CN       102136498 A     7/2011
CN       102867736 A     1/2013
(Continued)

*Primary Examiner* — Jack S Chen
(74) *Attorney, Agent, or Firm* — Nelson Mullins Riley & Scarborough LLP; Kongsik Kim, Esq.

(57) ABSTRACT

The present disclosure discloses a method of manufacturing a thin film transistor (TFT) array substrate including a step of preparing a patterned active layer on a base substrate, wherein the step includes: sequentially forming an amorphous silicon (a-Si) thin film layer and a boron-doped (B-doped) amorphous silicon germanium (a-SiGe) thin film layer on the base substrate; performing crystallization on the a-Si thin film layer and the B-doped a-SiGe thin film layer using a thermal annealing process to obtain a polycrystalline silicon (poly-Si) thin film layer and a B-doped polycrystalline silicon germanium (poly-SiGe) thin film layer; and forming the patterned active layer by using a photolithography process to etch the poly-Si thin film layer and the B-doped poly-SiGe thin film layer. The present disclosure further discloses a TFT array substrate and a display device including the TFT array substrate.

6 Claims, 5 Drawing Sheets

(52) U.S. Cl.
CPC .... *H01L 29/78675* (2013.01); *H01L 21/0262* (2013.01); *H01L 21/02532* (2013.01); *H01L 21/02592* (2013.01); *H01L 21/02667* (2013.01)

(56) References Cited

FOREIGN PATENT DOCUMENTS

| CN | 105280679 A | 1/2016 |
|----|-------------|--------|
| CN | 105355593 A | 2/2016 |
| CN | 105514116 A | 4/2016 |
| CN | 106057735 A | 10/2016 |
| CN | 106098628 A | 11/2016 |
| CN | 106409844 A | 2/2017 |

* cited by examiner

THIN FILM TRANSISTOR ARRAY SUBSTRATE, METHOD OF MANUFACTURING THE SAME, AND DISPLAY DEVICE INCLUDING THIN FILM TRANSISTOR SUBSTRATE

CROSS-REFERENCES TO RELATED APPLICATION

This application is a U.S. national phase application, pursuant to 35 U.S.C. § 371, of PCT/CN2017/093424, filed Jul. 18, 2017, designating the United States, which claims priority to Chinese Application No. 201710508076.9, filed Jun. 28, 2017. The entire contents of the aforementioned patent applications are incorporated herein by this reference.

TECHNICAL FIELD

The present disclosure relates to the technical field of a display, and in particular, to a thin film transistor array substrate, a method of manufacturing the same, and a display device including the thin film transistor array substrate.

BACKGROUND ART

Flat-panel display devices have numerous advantages of thin body, power saving, no radiation and so on, and thus are widely applied. The current flat-panel display devices mainly include liquid crystal display (LCD) devices, and organic light emitting display (OLED) devices. A thin film transistor (TFT) is a significant component of a flat-panel display device, may be formed on a glass substrate or a plastic substrate, and is generally applied to the LCD, OLED and the like as a light emitting device and a driving device.

Polycrystalline silicon (poly-Si) thin film is formed of a large amount of small grains with different sizes and different crystal orientations, wherein a grain size generally ranges from tens to hundreds of nanometers, and a large grain size may reach several microns. The poly-Si thin film formed of large grains has higher migration rate that is approximate to a migration rate of bulk materials. Thus, the poly-Si thin film has been widely applied to the manufacturing of semiconductor devices. For example, the TFTs in the products of LCD or OLED mostly adopt the poly-Si thin film as an active layer.

Currently, a method of manufacturing the poly-Si thin film mainly firstly prepares amorphous silicon (a-Si) thin film, and then performs a crystallization process on the a-Si film to obtain the poly-Si thin film. The crystallization process performed on the a-Si thin film mainly includes excimer laser anneal (ELA), metal induced crystallized (MIC), metal induced lateral crystallization (MILC), solid-phase crystallization (SPC) and so on. If the poly-Si is manufactured using the ELA, the poly-Si has low defect state density, and it is difficult to manufacture a large area of the poly-Si thin film; in addition, the device used by this method is expensive, and the cost is high. In the poly-Si thin films manufactured using the MIC and MILC, there is much metal residual, so that characteristics of the TFT become worse. The poly-Si thin film having the larger grain size may be manufactured using the SPC. However, if this method is applied to manufacturing the TFT array substrate, since a base substrate is easily deformed at high temperature, it needs to set a temperature of the crystallization lower, and the reduction of the crystallization temperature causes crystallization time to be greatly increased, thereby reducing production efficiency.

SUMMARY

For this purpose, the present disclosure provides a method of manufacturing a thin film transistor (TFT) array substrate, which adopts solid-phase crystallization (SPC) to manufacture a poly-Si thin film as an active layer. The method may reduce a crystallization temperature and avoid deformation of a base substrate while shortening crystallization time and improving production efficiency.

In order to achieve the above purpose, the present disclosure adopts the following technical solution.

A method of manufacturing a TFT array substrate including a step of preparing a patterned active layer on the base substrate, which includes:

sequentially forming an amorphous silicon (a-Si) thin film layer and a boron-doped (B-doped) amorphous silicon germanium (a-SiGe) thin film layer on the base substrate;

performing crystallization on the a-Si thin film layer and the B-doped a-SiGe thin film layer using a thermal annealing process to convert the a-Si thin film layer into a polycrystalline silicon (poly-Si) thin film layer and to convert the B-doped a-SiGe thin film layer into a B-doped polycrystalline silicon germanium (poly-SiGe) thin film layer;

forming a patterned active layer by using a photolithography process to etch the poly-Si thin film layer and the B-doped poly-SiGe thin film layer, the active layer including an active region that includes a channel region and a source region and a drain region located at opposite sides of the channel region, wherein the active region is formed by etching the poly-Si thin film layer, the poly-SiGe thin film layer above the source region is remained to form a first contact layer, and the poly-SiGe thin film layer above the drain region is remained to form a second contact layer.

The method specifically includes as follows.

Step S1, forming the patterned active layer on the base substrate;

Step S2, forming a gate insulating layer on the active layer;

Step S3, forming a patterned first metal layer on the gate insulating layer by using a photolithography process, the first metal layer including a gate electrode and scan lines;

Step S4, forming an interlayer dielectric layer on the gate electrode and the scan lines;

Step S5, forming a first viahole through which the first contact layer is exposed and a second viahole through which the second contact layer is exposed, by using a photolithography process to etch the interlayer dielectric layer and the gate insulating layer;

Step S6, forming a patterned second metal layer on the interlayer dielectric layer by using a photolithography process, wherein the second metal layer includes a source electrode, a drain electrode and data lines, the source electrode is connected to the first contact layer through the first viahole, and the drain electrode is connected to the second contact layer through the second viahole;

Step S7, forming a planarizing layer on the source electrode, the drain electrode and the data lines;

Step S8, forming a third viahole through which the source electrode or the drain electrode is exposed, by using a photolithography process to etch the planarizing layer;

Step S9, forming a patterned transparent conductive layer on the planarizing layer by using a photolithography process, wherein the transparent conductive layer includes a pixel electrode, and the pixel electrode is connected to the source electrode or the drain electrode through the third viahole.

The thermal annealing process is performed at a temperature of 500 to 1000° C. for 5 to 60 min The active layer further includes a storage capacitor region, and the storage capacitor region remains the poly-Si thin film layer and the poly-SiGe thin film layer while performing the patterning.

A thickness of the B-doped a-SiGe thin film layer is from 20 to 200 nm.

The present disclosure further provides a TFT array substrate including an active layer, a source electrode and a drain electrode disposed on a base substrate, wherein the active layer includes an active region including a channel region and a source region and a drain region located at opposite sides of the channel region, a first contact layer is disposed on the source region, the source electrode is electrically connected to the source region through the first contact layer, a second contact layer is disposed on the drain region, and the drain electrode is electrically connected to the drain region through the second contact layer. A material of the active layer is poly-Si, and materials of the first and second contact layers are B-doped poly-SiGe.

The TFT array substrate includes: the base substrate; the active layer patterned on the base substrate; a gate insulating layer covering the active layer; a first metal layer patterned on the gate insulating layer, the first metal layer including a gate electrode and scan lines; an interlayer dielectric layer covering the gate electrode and the scan lines; a second metal layer patterned on the interlayer dielectric layer, the second metal layer including the source electrode, the drain electrode and data lines, wherein the source electrode is connected to the first contact layer through a first viahole disposed in the interlayer dielectric layer and the gate insulating layer, and the drain electrode is connected to the second contact layer through a second viahole disposed in the interlayer dielectric layer and the gate insulating layer; a planarizing layer covering the source electrode, the drain electrode and the data lines; a transparent conductive layer patterned on the planarizing layer, the transparent conductive layer including a pixel electrode, wherein the pixel electrode is connected to the source electrode or the drain electrode through a third viahole disposed in the planarizing layer.

The active layer further includes a storage capacitor region including a poly-Si layer and a B-doped poly-SiGe layer sequentially disposed on the base substrate.

Thicknesses of the first contact layer and the second contact layers are from 20 to 200 nm, respectively.

On another aspect, the present disclosure provides a display device including the above-mentioned TFT array substrate.

The method of manufacturing the TFT array substrate provided in the embodiment of the present disclosure adopts the SPC to manufacture the poly-Si thin film as the active layer, wherein the B-doped a-SiGe thin film layer is manufactured on the a-Si thin film layer. The B-doped a-SiGe thin film layer may induce the a-Si thin film layer to be converted into the poly-Si thin film while performing the SPC, thereby reducing the crystallization temperature of the a-Si thin film and shortening the crystallization time thereof. Thus, the deformation of the base substrate due to the high temperature is avoided, and the production efficiency is improved.

DETAILED DESCRIPTION OF EXEMPLARY EMBODIMENTS

Figure 1A:
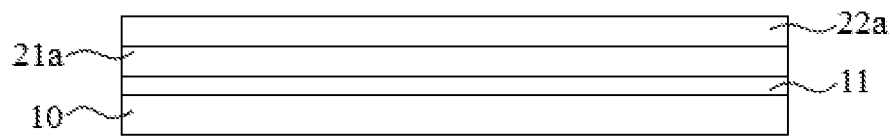
FIGS. 1a-1k are exemplary diagrams illustrating structures of devices obtained at respective steps in a method of manufacturing a thin film transistor (TFT) array substrate according to an embodiment of the present disclosure.

In order for the purpose, technical solution and advantages of the present disclosure to be clearer, the embodiments of the present disclosure will be explained in details below in conjunction with the drawings. The preferred embodiments are exemplified in the drawings. The embodiments of the present disclosure as shown in the drawings and as described according to the drawings are only exemplified, and the present disclosure is not limited to these embodiments.

Here, it is also worthy to note that, in order to prevent the present disclosure from being obscured due to unnecessary details, the drawings only illustrate the structure and/or processing steps closely related to the solution based on the present disclosure, while other details less related to the present disclosure are omitted.

The present disclosure firstly provides a method of manufacturing a thin film transistor (TFT) array substrate. Referring to FIGS. 1a-1k, the method includes the following steps.

Step S1: a patterned active layer 20 is manufactured on a base substrate 10. The step may specifically include the following sub-steps.

Step S11: as shown in FIG 1a, an amorphous silicon (a-Si) thin film layer 21a and a boron-doped (B-doped) amorphous silicon germanium (a-SiGe) thin film layer 22a are sequentially formed by deposition on the base substrate 10. It is preferable to form a buffer layer 11 on the base substrate 10 prior to depositing the a-Si thin film layer 21a and the B-doped a-SiGe thin film layer 22a on the base substrate 10. The buffer layer 11 may be a silicon oxide ($SiO_x$) layer or a silicon oxynitride ($SiN_x$) layer, or a composite structure layer formed by laminating a $SiO_x$ layer and a $SiN_x$ layer. When depositing the B-doped a-SiGe thin film layer 22a, a main raw material is also a material for forming the a-Si thin film, and $GeH_4$ and $BH_3$ gases are further introduced at the same time, thereby obtaining the B-doped a-SiGe thin film layer 22a. In a preferable solution, a thickness of the B-doped a-SiGe thin film layer 22a may be selected to be from 20 to 200 nm.

Figure 1B:
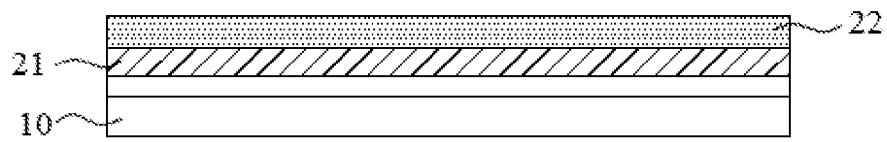
Figure 1C:
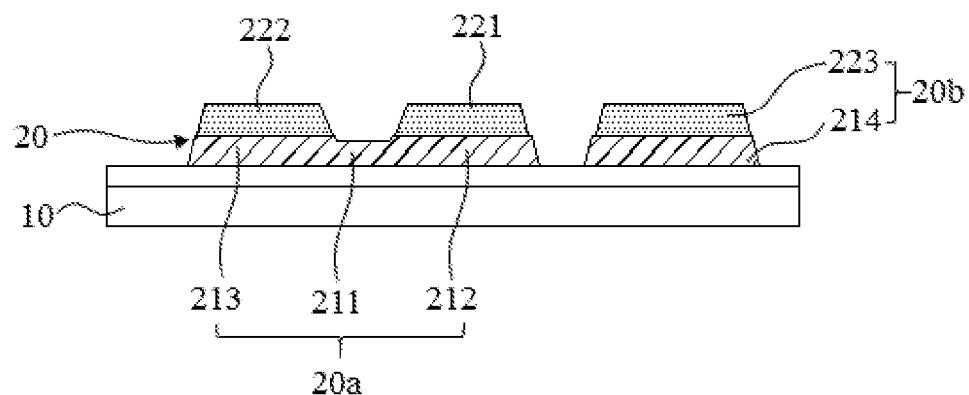

Step S12: as shown in FIG 1b, solid-phase crystallization (SPC) is applied to perform the crystallization. Specifically, the deposited a-Si thin film layer 21a and B-doped a-SiGe thin film layer 22a are put into an annealing furnace to crystallize the a-Si thin film layer 21a and the B-doped a-SiGe thin film layer 22a using a rapid thermal annealing process, so as to convert the a-Si thin film layer 21a into a polycrystalline silicon (poly-Si) thin film layer 21 and to convert the B-doped a-SiGe thin film layer 22a into a B-doped polycrystalline silicon germanium (poly-SiGe) thin film layer 22. The thermal annealing process is performed at a temperature of 500 to 1000° C. for 5 to 60 min Step S13: as shown in FIG 1c, a photolithography process is applied to etch the poly-Si thin film layer 21 and the B-doped poly-SiGe thin film layer 22 to form a patterned active layer 20. The active layer 20 includes an active region 20a including a channel region 211 and a source region 212 and a drain region 213 which are located at opposite sides of the channel region. The active region 20a is formed by etching the poly-Si thin film layer 21. The poly-SiGe thin film layer 22 above the source region 212 is remained to form a first contact layer 221. The poly-SiGe thin film layer 22 above the drain region 213 is remained to form a second contact layer 222. The poly-SiGe thin film layer 22 above the channel region 211 is entirely removed by etching.

In the present embodiment, as shown in FIG. 1c, the active layer 20 further includes a storage capacitor region 20b disposed on the same layer as the active region 20a. The storage capacitor region 20b includes a laminated poly-Si layer 214 and a B-doped poly-SiGe layer 223. In particular, the poly-Si thin film layer 21 and the poly-SiGe thin film layer 22 corresponding to the position of the storage capacitor region 20b are remained simultaneously while performing the patterning (photolithography process) on the poly-Si thin film layer 21 and the poly-SiGe thin film layer 22. The poly-Si layer 214 is formed by etching the poly-Si thin film layer 21, and the poly-SiGe layer 223 is formed by etching the poly-SiGe thin film layer 22.

Figure 1D:
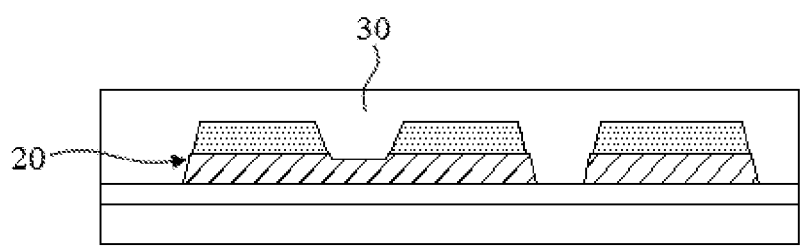

Step S2: as shown in FIG. 1d, a gate insulating layer 30 is formed on the active layer 20. In particular, the gate insulating layer 30 may be a $SiO_x$ layer or a $SiN_x$ layer, or a composite structure layer formed by laminating a $SiO_x$ layer and a $SiN_x$ layer.

Figure 1E:
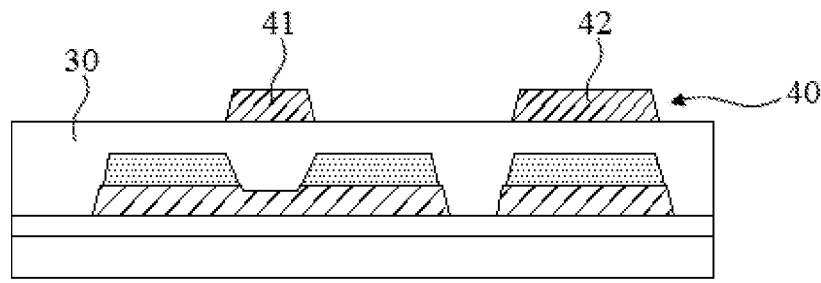

Step S3: as shown in FIG. 1e, the photolithography process is applied to form a patterned first metal layer 40 on the gate insulating layer 30, and the first metal layer 40 includes a gate electrode 41 and scan lines 42. In particular, the gate electrode 41 is relatively located right above the channel region 211, and one of the scan lines 42 is relatively located right above the storage capacitor region 20b. A material of the first metal layer 40 is selected from one or more of Cr, Mo, Al, Cu, but it is not limited thereto, and the first metal layer 40 may be one layer or stacked multi-layer.

Figure 1F:
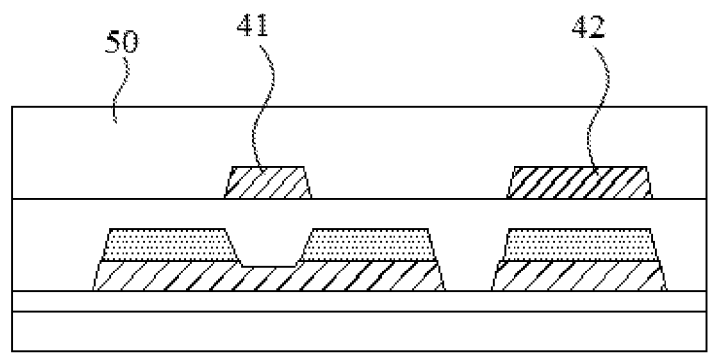

Step S4: as shown in FIG. 1f, an interlayer dielectric layer 50 is formed on the gate electrode 41 and the scan lines 42. In particular, the interlayer dielectric layer 50 may be a $SiO_x$ layer or a $SiN_x$ layer, or a composite structure layer formed by laminating a $SiO_x$ layer and a $SiN_x$ layer.

Figure 1G:
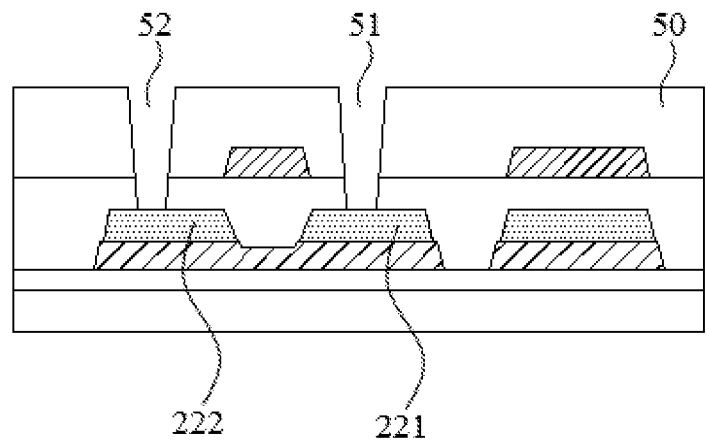

Step S5: as shown in FIG. 1g, the photolithography process is applied to etch the interlayer dielectric layer 50 and the gate insulating layer 30 to form a first viahole 51 through which the first contact layer 221 is exposed and a second viahole 52 through which the second contact layer 222 is exposed.

Figure 1H:
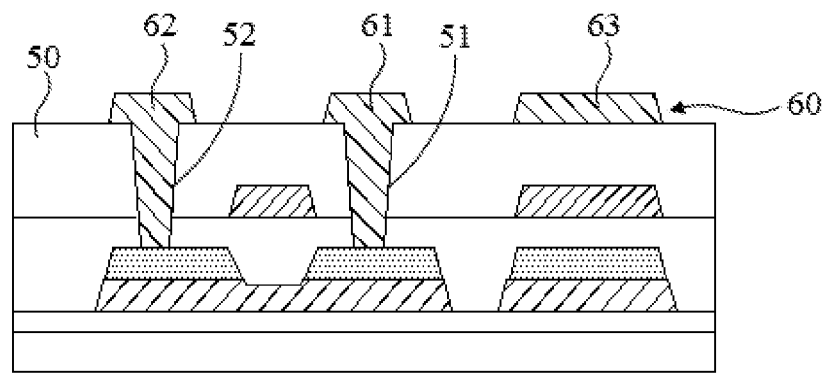

Step S6: as shown in FIG. 1h, the photolithography process is applied to form a patterned second metal layer 60 on the interlayer dielectric layer 50, the second metal layer 60 including a source electrode 61, a drain electrode 62 and data lines 63, the source electrode 61 being connected to the first contact layer 221 through the first viahole 51, and the drain electrode 62 being connected to the second contact layer 222 through the second viahole 52. A material of the second metal layer 60 is selected from one or more of Cr, Mo, Al, Cu, but it is not limited thereto, and the second metal layer 60 may be one layer or stacked multi-layer. One of the data lines 63 is relatively located right above the storage capacitor region 20b.

Figure 1I:
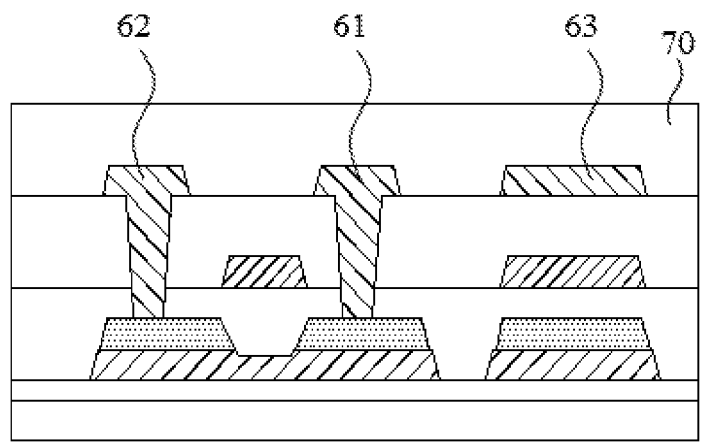

Step S7, as shown in FIG. 1i, a planarizing layer 70 is formed on the source electrode 61, the drain electrode 62 and the data lines 63. In particular, the planarizing layer 70 may be a $SiO_x$ layer or a $SiN_x$ layer, or a composite structure layer formed by laminating a $SiO_x$ layer and a $SiN_x$ layer.

Figure 1J:
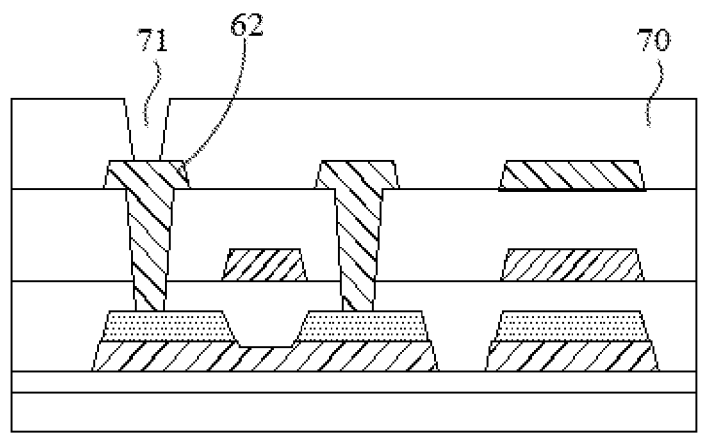

Step S8: as shown in FIG. 1j, the photolithography process is applied to etch the planarizing layer 70 to form a third viahole 71 through which the drain electrode 62 is exposed.

Figure 1K:
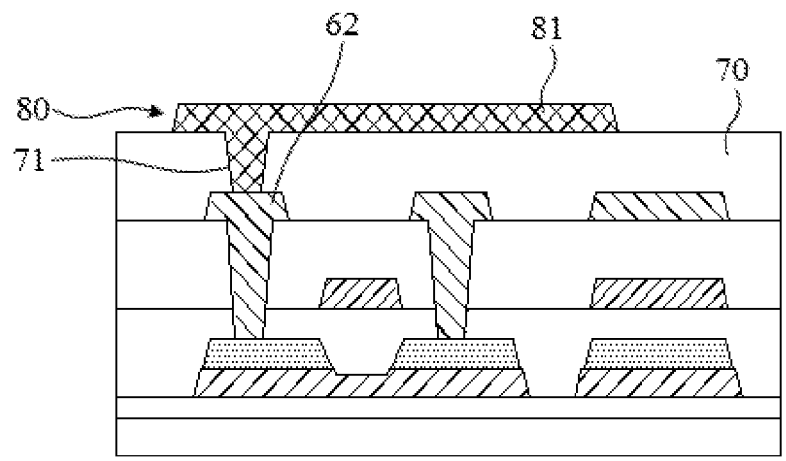

Step S9: as shown in FIG 1k, the photolithography process is applied to form a patterned transparent conductive layer 80 on the planarizing layer 70, the transparent conductive layer 80 including a pixel electrode 81, wherein the pixel electrode 81 is connected to the drain electrode 62 through the third viahole 71.

It needs to explain that in Step S8, the third viahole 71 may also be disposed to correspond to the position of the source electrode 61, and at the time, in Step S9, the pixel electrode 81 is connected to the source electrode 61 through the third viahole 71.

In the above processes, the photolithography process (patterning process) is adopted in a plurality of steps. The photolithography process performed each time respectively includes processes of masking, exposure, developing, etching, stripping and so on, and the etching process includes dry etching and wet etching. The photolithography process has been a relatively mature technology in the art, and thus is not explained in details here.

The method of manufacturing the TFT array substrate provided in the above embodiment adopts the SPC to manufacture the poly-Si thin film as the active layer, wherein the B-doped a-SiGe thin film layer is manufactured on the a-Si thin film layer. The crystallization is started from the B-doped a-SiGe thin film layer while performing the SPC. Since the crystallization temperature of the B-doped a-Si thin film layer is lower, the B-doped a-Si thin film layer may be rapidly converted into the B-doped poly-SiGe thin film layer at the lower temperature so as to further induce the a-Si thin film layer to be converted into the poly-Si thin film, thereby reducing the crystallization temperature of the a-Si thin film and shortening the crystallization time thereof. Thus, the deformation of the base substrate due to the high temperature is avoided, and the production efficiency is improved. In the embodiment of the present disclosure, the B-doped a-SiGe thin film layer is prepared by the deposition process, and the $GeH_4$ and $BH_3$ gases are introduced while depositing the a-Si thin film material, thereby obtaining the B-doped a-SiGe thin film layer. The production cost is lower, compared to an ion implantation method.

Figure 2:
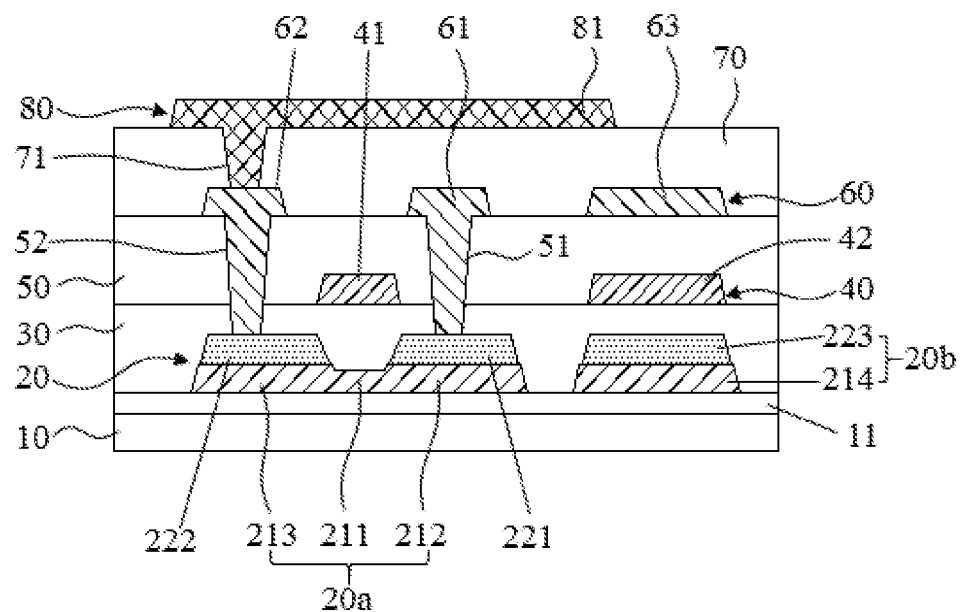
FIG. 2 is a structural schematic diagram of a TFT array substrate provided by an embodiment of the present disclosure.

The present embodiment further provides the TFT array substrate manufactured according to the manufacturing method mentioned above. As shown in FIG. 2, the TFT array substrate includes an active layer 20, a gate insulating layer 30, a first metal layer 40, an interlayer dielectric layer 50, a second metal layer 60, a planarizing layer 70 and a transparent conductive layer 80 sequentially disposed on a base substrate 10.

A buffer layer 11 is further provided between the active layer 20 and the base substrate 10. The active layer 20 includes an active region 20a including a channel region 211 and a source region 212 and a drain region 213 located at opposite sides of the channel region 211. A first contact layer 221 is disposed on the source region 212. A material of the active layer 20a is a poly-Si. Materials of the first contact layer 221 and a second contact layer 222 is a B-doped poly-SiGe. In the present embodiment, the active layer 20 further includes a storage capacitor region 20b disposed on the same layer as the active region 20a, and the storage capacitor region 20b includes a laminated poly-Si layer 214 and a B-doped poly-SiGe layer 223. In a preferable solution, thicknesses of the first contact layer 221 and the second contact 222 are preferably set to be from 20 to 200 nm, respectively.

The first metal layer 40 includes a gate electrode 41 and scan lines 42. The gate electrode 41 is relatively located right above the channel region 211, and one of the scan lines 42 is relatively located right above the storage capacitor region 20b.

The second metal layer 60 includes a source electrode 61, a drain electrode 62 and data lines 63. The source electrode 61 is connected to the first contact layer 221 through the first viahole 51 disposed in the interlayer dielectric layer 50 and the gate insulating layer 30. The drain electrode 62 is connected to the second contact layer 222 through the second viahole 52 disposed in the interlayer dielectric layer 50 and the gate insulating layer 30. One of the data lines 63 is relatively located right above the storage capacitor region 20b.

The transparent conductive layer 80 includes a pixel electrode 81. The pixel electrode 81 is connected to the drain electrode 62 through a third viahole 71 disposed in the planarizing layer 70. In some other embodiments, the pixel electrode 81 may be connected to the source electrode 61 through the third viahole 71.

In the TFT array substrate provided in the above embodiment, the source electrode 61 and the drain electrode 62 are connected to the corresponding source region 212 and drain region 213 through the first and second contact layers 221 and 222 made of the material of B-doped poly-SiGe. Contact resistances between the source electrode 61 and the source region 212 and between the drain electrode 62 and the drain region 213 are reduced, thereby improving electricity performance of the TFT.

Figure 3:
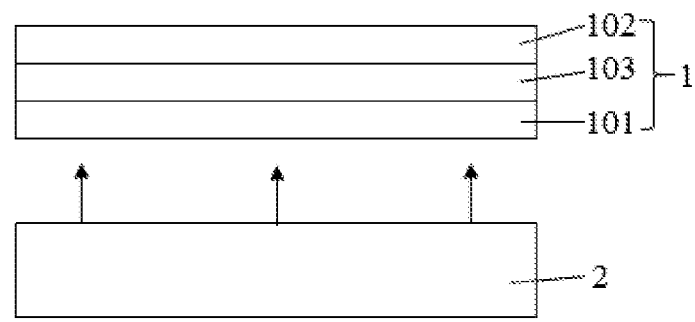
FIG. 3 is a structural schematic diagram of a display device provided by an embodiment of the present disclosure.

The present embodiment further provides a display device adopting the TFT array substrate provided by the embodiment of the present disclosure. The display device may be, for example, a thin film transistor-liquid crystal display (TFT-LCD) device or an organic light emitting display (OLED) device. The display device adopts the TFT array substrate provided by the embodiment of the present disclosure, so that the display device has superior performances with respect to the display devices in the prior art, while the cost is reduced. In particular, the TFT-LCD device is taken as an example. Referring to FIG. 3, the LCD device includes a liquid crystal panel 1 and a backlight module 2 disposed to be opposite to each other. The backlight module 2 provides a display light source to the liquid crystal panel 1, such that the liquid crystal panel 1 displays an image. The liquid crystal panel 1 includes an array substrate 101 and a filter substrate 102 disposed to be opposite to each other, and further includes a liquid crystal layer 103 between the array substrate 101 and the filter substrate 102. The array substrate 101 adopts the TFT array substrate provided by the embodiment of the present disclosure.

It should be explained that the relationship terms, such as first and second, etc., in the present text are only used for distinguishing one entity or operation from another entity or operation without requiring or implying any actual relation or sequence existing between these entities or operations. Moreover, the terms "include", "including", "contain" "containing" mean covering non-exclusive inclusion, so that the process, method, object or device including a series of factors not only includes those factors but also includes other factors that are not explicitly listed, or further includes inherent factors for this process, method, object or device. Without more limitations, the factors defined by the sentence "include one . . . " do not exclude additional identical factors existing in the process, method, object or device which includes the factors.

The above mentioned is only the specific embodiments of the present application, it should be pointed out that, to those ordinary skilled in the art, several improvements and modifications can be made and considered as the protection scope of the present application, without departing from the principle of the present application.

What is claimed is:

1. A method of manufacturing a thin film transistor (TFT) array substrate, comprising a step of preparing a patterned active layer on a base substrate, wherein the step comprises:
   sequentially forming an amorphous silicon (a-Si) thin film layer and a boron-doped (B-doped) amorphous silicon germanium (a-SiGe) thin film layer on the base substrate;
   performing crystallization on the a-Si thin film layer and the B-doped a-SiGe thin film layer using a thermal annealing process to convert the a-Si thin film layer into a polycrystalline silicon (poly-Si) thin film layer and to convert the B-doped a-SiGe thin film layer into a B-doped polycrystalline silicon germanium (poly-SiGe) thin film layer; and
   forming the patterned active layer by using a photolithography process to etch the poly-Si thin film layer and the B-doped poly-SiGe thin film layer, the active layer comprising an active region that includes a channel region and a source region and a drain region located at opposite sides of the channel region, wherein the active region is formed by etching the poly-Si thin film layer, the poly-SiGe thin film layer above the source region is remained to form a first contact layer, and the poly-SiGe thin film layer above the drain region is remained to form a second contact layer.

2. The method of claim 1, specifically comprising:
Step S1 of forming the patterned active layer on the base substrate;
Step S2 of forming a gate insulating layer on the active layer;
Step S3 of forming a patterned first metal layer on the gate insulating layer by using a photolithography process, the first metal layer comprising a gate electrode and scan lines;
Step S4 of forming an interlayer dielectric layer on the gate electrode and the scan lines;
Step S5 of forming a first viahole through which the first contact layer is exposed and a second viahole through which the second contact layer is exposed, by using a photolithography process to etch the interlayer dielectric layer and the gate insulating layer;
Step S6 of forming a patterned second metal layer on the interlayer dielectric layer by using a photolithography process, the second metal layer comprising a source electrode, a drain electrode and data lines, wherein the source electrode is connected to the first contact layer through the first viahole, and the drain electrode is connected to the second contact layer through the second viahole;
Step S7 of forming a planarizing layer on the source electrode, the drain electrode and the data lines;
Step S8 of forming a third viahole through which the source electrode or the drain electrode is exposed, by using a photolithography process to etch the planarizing layer; and
Step S9 of forming a patterned transparent conductive layer on the planarizing layer by using a photolithography process, the transparent conductive layer including a pixel electrode, wherein the pixel electrode is connected to the source electrode or the drain electrode through the third viahole.

3. The method of claim 1, wherein the thermal annealing process is performed at a temperature of 500 to 1000° C. for 5 to 60 min.

4. The method of claim 1, wherein the active layer further comprises a storage capacitor region, and the storage capacitor region remains the poly-Si thin film layer and the poly-SiGe thin film layer simultaneously while performing the patterning.

5. The method of claim 1, wherein a thickness of the B-doped a-SiGe thin film layer is from 20 to 200 nm.

6. The method of claim 1, wherein the B-doped a-SiGe thin film layer is prepared by a deposition process, and $GeH_4$ and $BH_3$ gases are introduced while depositing an a-Si thin film material, thereby obtaining the B-doped a-SiGe thin film layer.

* * * * *